United States Patent [19]

Berkowitz et al.

[11] Patent Number: 4,788,507

[45] Date of Patent: Nov. 29, 1988

[54] PEAK TIMEOUT INDICATOR/ENCODER AND METHOD

[75] Inventors: Murray L. Berkowitz, Forest Hills; David J. Mazurek, Hauppauge, both of N.Y.

[73] Assignee: Eaton Corporation, Cleveland, Ohio

[21] Appl. No.: 45,335

[22] Filed: May 4, 1987

[51] Int. Cl.⁴ .................. H03K 5/153; G01R 19/04
[52] U.S. Cl. .............................. 328/151; 307/351; 307/359; 328/114; 328/132
[58] Field of Search ............... 307/351, 359; 328/114, 328/132, 151

[56] References Cited

U.S. PATENT DOCUMENTS

| 4,041,404 | 8/1977 | Lewis, Jr. ........................ 307/351 |
| 4,199,729 | 4/1980 | Durand et al. .................. 307/351 |
| 4,686,390 | 8/1987 | Cleary, Jr. et al. ............. 307/351 |

Primary Examiner—John Zazworsky
Attorney, Agent, or Firm—C. H. Grace

[57] ABSTRACT

A digital circuit for measuring the peak amplitude of a pulse and indicating the time at which the peak occurred. The pulse signal is sampled at clock intervals and digitized. The first sample that is greater than a threshold is stored in a peak register (PR), and a preset timer (PT) is started. Amplitude samples are attenuated (SN) by a predetermined amount. If, before the timer times out, a subsequent amplitude sample is received whose attenuated value has a greater amplitude, its unattenuated value replaces the stored one. The timer is then restarted. This replacement procedure is repeated until the timer times out without any superseding greater attenuated amplitude sample having been received. A strobe pulse is then generated. A pulse validation circuit and a noise suppression circuit are also disclosed.

17 Claims, 4 Drawing Sheets

PEAK TIMEOUT INDICATOR/ENCODER AND METHOD

FIELD

This invention relates to measurement of pulse parameters; it is a method and circuit for analyzing a pulse to measure its peak amplitude and the time of occurrence of the peak.

PRIOR ART

A very brief description of one prior art circuit is helpful in later describing the invention. The prior circuit of FIG. 1 receives a pulse signal at its input terminal A and provides and holds a peak amplitude signal at its output terminal D. In FIG. 2, voltages at terminals A, B, and C respectively of FIG. 1 are depicted as stylized signals $V_a$, $V_b$, and $V_c$.

A logarithmic input pulse signal $V_a$ is delayed by a circuit TD whose output $V_c$ is applied to a follow-and-hold circuit FH. The circuit FH memorizes $V_c$ when a hold command is applied to terminal E. That occurs when the voltage $V_c$ at an input of a comparator HC exceeds the voltage $V_b$ at another input, provided that HC then has an enable signal at terminal EN. $V_b$ is produced by subtracting a predetermined amount X dB from $V_a$ in a subtractor SU, to reduce spurious triggering of FH. EN has an enabling signal whenever $V_a$ exceeds a threshold voltage VT, as determined by a threshold comparator TH. When $V_c$ overtakes $V_b$ at time H, HC commands FH to hold the instantaneous voltage $V_c$ at the output terminal D.

One of the problems with this type of prior circuit is that is cannot accurately measure, with the same circuit design parameters, both very narrow pulses and slow rise time pulses. For narrow pulses the time delay TD should be small, but for slow pulses it should be large. The subtracted value X dB must be large enough to exceed the noise on the pulse in order to prevent false peak identification, but if X dB is large the delay TD must be even larger to ensure that slow rise time pulses will rise by more than X dB during the delay. This requirement makes matters worse for narrow pulses because this prior circuit does not operate correctly on pulses shorter than the delay time.

SUMMARY OF THE INVENTION

An object of the invention is to provide a method and circuit that are capable of accurately measuring the maximum amplitude of pulses having a wide range of rise times and durations.

An object is to provide a method and circuit that indicate the time of occurrence of the maximum amplitude accurately over a wide range of risetimes and durations.

An object is to provide a method and circuit that reject false indications that the pulse is at a maximum amplitude, in favor of the true maximum amplitude.

BRIEF DESCRIPTION OF THE DRAWINGS

FIG. 6 is a diagram of circuits for subtracting an amount from the pulse amplitude to reduce spurious triggering by noise.

DETAILED DESCRIPTION

Figure 1:
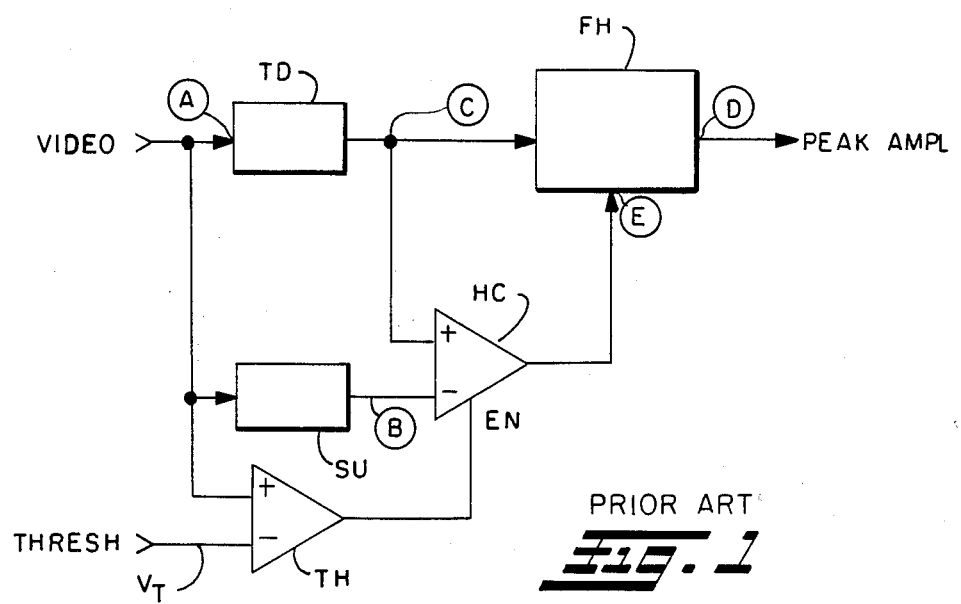
FIG. 1 shows a block diagram of a peak detection circuit of the prior art.
Figure 2:
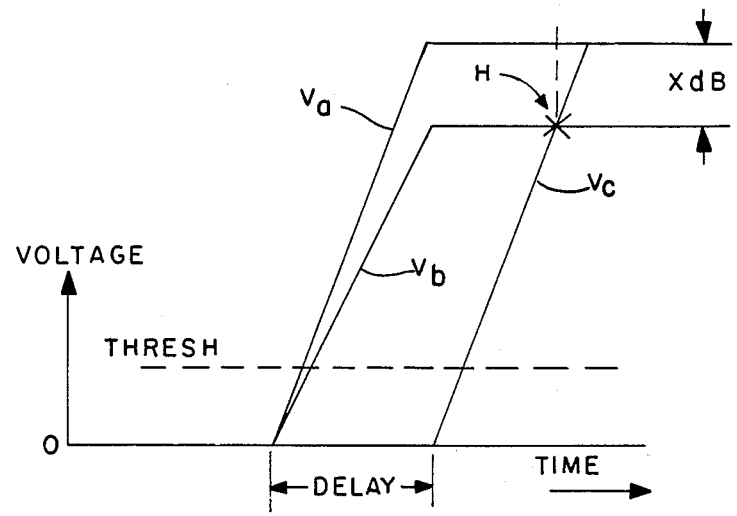
FIG. 2 is a graph of stylized waveforms of the prior art.
Figure 3:
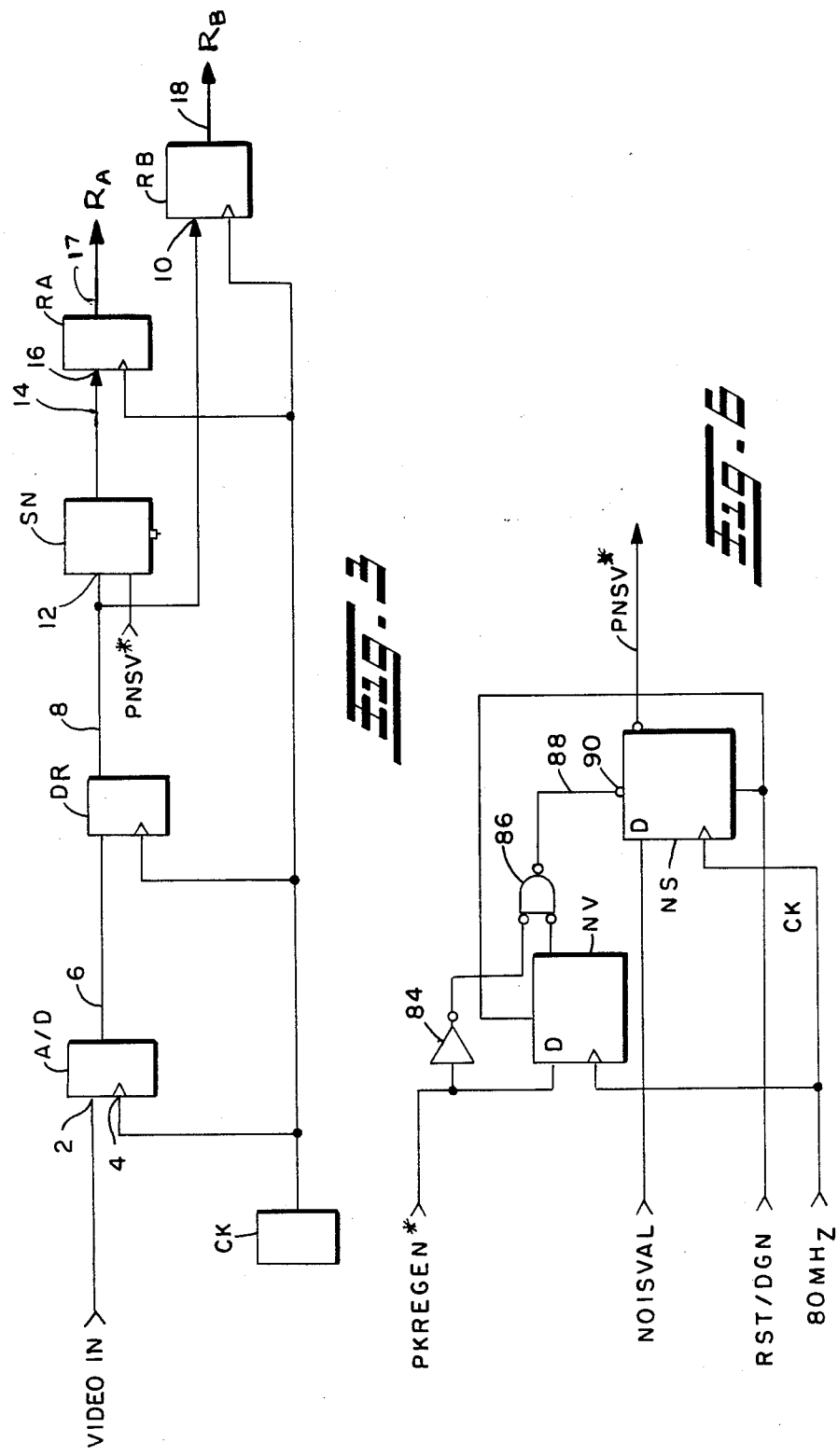
FIG. 3 is a block diagram of an input portion of a preferred embodiment of the invention, including amplitude sampling equipment.

In the preferred embodiment being described, an analog input signal comes from a logarithmic video amplifier (not shown) into a terminal 2 of an analog to digital converter (A/D) as shown in FIG. 3. The A/D samples the amplitude of the video signal under the control (terminal 4) of an 80 MHz oscillator CK. The A/D output at 6 is loaded into a data register DR.

The digital output 8 of DR is connected to inputs 10 of a register RB and to inputs 12 of an adder SN. The adder is used to subtract a noise buffer amount PNSV from the incoming amplitude data under certain conditions described later. The outputs 14 of the adder go to inputs 16 of a register RA.

Figure 4:
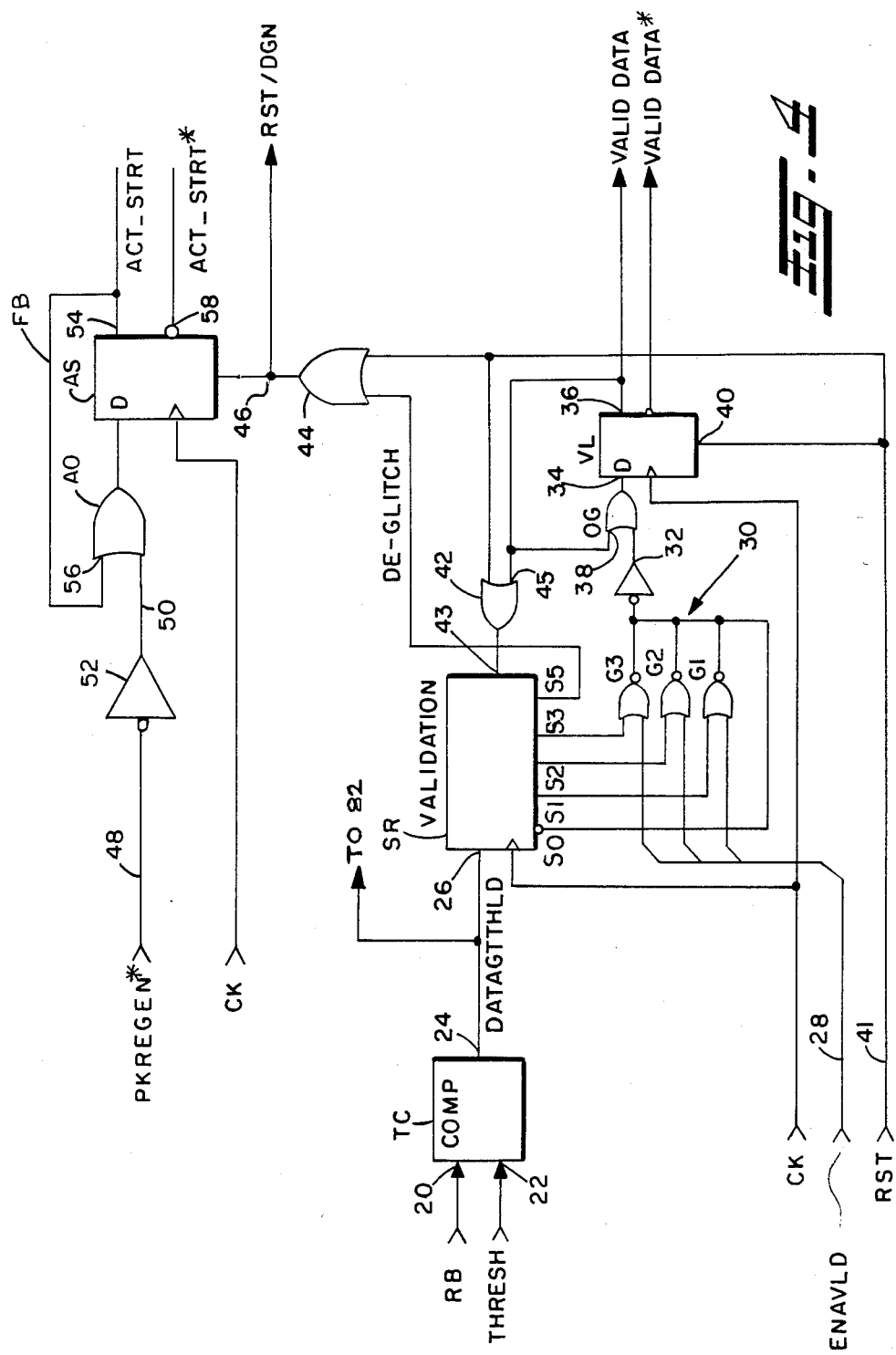
FIG. 4 is a block diagram of pulse validation and activity start circuits.

The output data of 18 of RB is connected to terminals 20 of a threshold comparator TC, FIG. 4, and data representing a programmed threshold level is connected to terminals 22. The threshold is programmable in a four bit field. TC produces a command signal at its output terminal 24 when the data from RB exceeds the threshold. Incoming data must be greater than threshold before the decoder takes action. The threshold level should be chosen so that the output of the threshold comparator does not go active very frequently when valid pulse data is not present.

In order for a pulse to be considered valid (not merely noise), the pulse amplitude must be greater than the programmable threshold for at least a predetermined number of consecutive samples. Validation of pulses by this criterion is illustrated in FIG. 4. The predetermined requisite number is programmable from one to four data samples. Upon each cycle of the clock CK, the output status of TC at 24 is shifted into the serial input of a pulse validation shift register SR. SR has parallel register outputs S0, S1, S2 and S3, three of which are gated in inverting OR gates G1, G2, G3 with the programmed sample count, ENAVLD, 28. S0 and the outputs of the gates G1, G2, and G3 are wired together so that the gates and an inverter 32 form a simple decoder 30. The decoder produces an output signal from 32 when the data amplitude exceeds the threshold at 22 for the predetermined number (standing at 28) of cycles of the clock CK.

When valid data is received, the output of 32 passes through an OR gate OG and presents an active high level to the D input 34 of flip-flop VL. The asserted output at 36 of the flip-flop VL goes high on the next clock signal, and is held high by a feedback connection to another input 38 of the OR gate OG. Flip-flop VL is later reset by a pulse at a terminal 40, which comes from equipment not shown, when the handling of the pulse data has been completed. The same reset pulse (41) is passed through an OR gate 42 to reset the shift register SR at a clear terminal 43. The valid data signal at 36 can also clear SR, by means of a signal passing through a second input 45 of the OR gate 42. For valid data this occurs before a later stage output S5 of SR can go active. If, however, data does not exceed the threshold for the predetermined number of consecutive samples, it is considered noise and S5 goes active, producing a de-glitch noise signal DGN before the valid data signal occurs at 36.

The de-glitch noise signal is connected, as is the system reset signal RST from terminal 41, to an OR gate 44. The output of 44 is a signal, called RST/DGN, at a terminal 46 that rapidly resets all encoder circuitry that contains noise information and prepares the encoder to accept new pulse data. The pulse detector does not lose any time in validating a pulse before processing it because validation is done in parallel with peak detection.

One of the subcircuits that is cleared by the RST/DGN pulse at 46 includes an activity start flip-flop AS, shown in FIG. 4. The input to this subcircuit is a downgoing PKREGEN* signal, which occurs at a terminal 48, and which involves a peak register to be described later. When a zero pulse occurs at 48, a high pulse occurs at an output 50 of an inverter 52. The high pulse passes through an OR gate AO to a D terminal of AS. AS receives clock pulses from CK, as do most of the subcircuits of the detector; the next clock pulse sets the output of AS, at its terminal 54, high. This high signal at 54 is called the activity start signal. It feeds back to another terminal 56 of the OR gate AO to hold AS active until it is reset later from terminal 46. The inverse of the high signal at 54 appears at a negated output terminal 58 of AS, and is employed to initiate the loading of a counter described below.

In the preferred embodiment the peak timeout detection circuit selects and memorizes the true peak of a pulse, and generates a strobe signal a fixed time delay after the peak. The portion of the circuit shown on FIG. 5 includes a peak timeout counter PT having a group of time interval input terminals TI for loading parallel data into it prior to countdown. The amount of the time interval is a "peak timeout" value which is programmable from 1 to 15 counts of the 80 MHz system clock. Counter PT also has a load synchronizing terminal SL for commanding the loading of data t the terminals TI, as well as a clock terminal for counting down the counter PT when clock pulses occur from CK.

Figure 5:
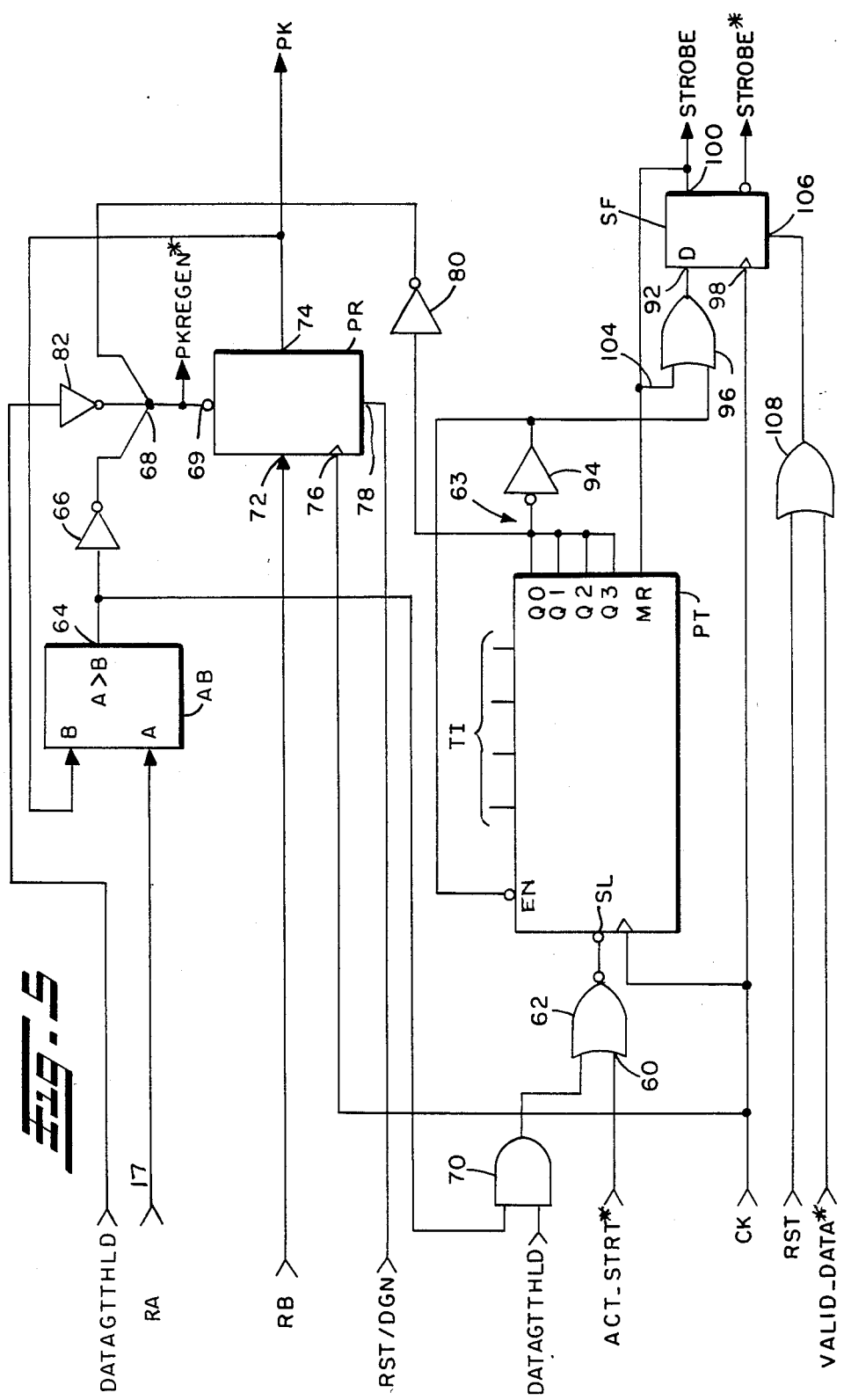
FIG. 5 represents circuits for timing out an interval following a possible peak, and for outputting data regarding the peak amplitude and producing a strobe signal.

As shown on FIG. 5, when activity has not started a high signal from 58 of FIG. 4 stands at terminal 60 of an inverting OR gate 62 and passes to an inverting terminal SL (Synchronize Loading) of the peak timeout counter PT. That signal causes the timer PT to be loaded to a programmed count that has been standing on its time interval terminals TI.

Counter PT's output terminals Q0, Q1, Q2, Q3, Q4 have data representing the status of the four stages of the counter; they are connected together to form a wired OR decoder 63 that recognizes when the counter has counted down to zero. PT also has a terminal EN for enabling and preventing its counting. Finally, PT has a reset terminal MR for putting all of its data stages in a zero state.

A comparator AB is provided, FIG. 5, for comparing data at its A terminals, which data represents a new sample of the amplitude of a pulse, with the data at its B terminals, which usually represents an older sample of the amplitude of the pulse. When the data A exceeds the data B an output is produced at a terminal 64 of comparator AB. The signal from 64 is connected through an inverter 66 to a wired OR whose output connection is terminal 68. The signal from 64 is also connected to an input of an AND gate 70 whose output signal goes to another input of the OR gate 62 and thence to the load synchronizing terminal SL of the peak timeout counter PT.

FIG. 5 also shows a peak register PR that has data input terminals 72 for receiving pulse amplitude data from register RB and data output terminals 74 for outputting its data contents. It has a clock terminal 76 for receiving pulses from the system clock CK.

The peak register PR is enabled and disabled from receiving data by applying control signals to a terminal 69. Terminal 69 receives its control signals from the wired OR arrangement 68, which has three inputs (a) the output of inverter 66 from comparator AB, (b) the output of an inverter 80 from the zero count detector 63 of binary counter PT, and (c) the output of an inverter 72 whose input comes from TC to indicate that the amplitude of the present input data is greater than threshold level.

The signal at terminal 69 is PKREGEN*; it is connected also to 48 of the activity start flip-flop AS shown in FIG. 4, and to a point in FIG. 6. A zero PKREGEN* signal indicates that the peak register is to be loaded, upon a clock cycle.

The peak register PR is cleared at a terminal 78 by the RST/DGN signal at the following times: (a) when power is turned on, (b) when the entire peak detector is reset after its currently processed pulse data descriptors have been read out by a circuit which follows the peak detector and, (c) when noise which exceeded the threshold is acted upon by the peak detector but is subsequently discarded (de-glitch) by the pulse validation circuit of FIG. 4.

At the start of a pulse, the first loading of PR with pulse amplitude data is made in the following sequence of events. The "activity start" flip-flop AS has already been cleared by the RST/DGN signal, so the counter PT has been loaded. A peak noise suppression circuit, which will be described later, has also been reset by the RST/DGN signal, and has not been activated as yet. The data B in the peak register PR is zero because PR has also been cleared by the reset signal.

Data from register DR goes into the register RB and, via the subtractor SN, into the register RA. Data exceeds threshold, so inverter 82 (FIG. 5) outputs a zero. The counter PT has a non-zero count so inverter 80 outputs a zero. The peak register PR has not accepted any data as yet so it still presents zero data at terminals B of the comparator AB. The output of comparator AB at terminal 64 is one because the data A exceeds the zero data at terminals B. Inverter 66 therefore outputs a zero. The control signal PKREGEN* is low because all inputs of the wired OR 68 are zero. PKREGEN* activates the AS register. It also enables, at 69, the peak register PR to load the data from RB standing at terminals 72.

Each pulse at the clock terminal of the peak timeout counter PT counts PT down by one count. If no greater amplitude sample occurs before the counter PT reaches zero, the amplitude reading in the peak register PR is treated as being the peak, and a strobe signal is generated as described later.

If instead a greater amplitude sample occurs before PT times out, the comparator AB produces another output signal at its terminal 64 and the new amplitude standing in register RB, which is greater than the old, is loaded into the peak register PR. The output signal at 64 resets the peak timeout counter PT to its full count, and the predetermined time interval starts again from the beginning. No strobe signal has been produced because the count in the peak timeout counter PT is not zero, which is a necessary condition as described below.

In a similar manner each new amplitude of the pulse that is qualified by the various screening circuits as a candidate for being the peak amplitude is compared in AB with the previously greatest amplitude, which is in PR. If, and only if, the new amplitude is greater than the old, the new amplitude is stored in PR in place of the old and the peak timeout counter is reloaded. When, finally, the peak timeout counter counts down to zero, the contents of PR are declared by the occurrence of a strobe pulse to be the peak amplitude of the entire pulse.

The purpose of the peak noise suppression circuits of FIG. 6 is to prevent noise or ripple which can be thought of as being on top of the pulse peak, from upsetting the peak detection circuit. It also protects the peak detection circuit from boundary changes of the A-D converter, from one output level to another. The circuit functions by providing a guard band when the input pulse i near its peak value to help the peak detection circuit to capture the true peak.

At the start of a pulse, the peak noise suppression function is inactive, so the register RA loads the same data as register RB. When the function is active, a predetermined number of decibels is subtracted from the data at the output of DR (FIG. 3), and loaded into the register RA. Register RA then contains smaller data than register RB. The contents of register RA are used in the comparision of new data against data that was previously stored in the peak register PR. The amount subtracted, called peak noise suppression value (PNSV), is programmable from 0 to 3 units, where each unit represents 1 dB in the embodiment being described. When PNSV is set to zero, SN does not subtract anything even when activated.

The effect of PNSV is as follows: before PNSV is active, new data need be larger than previously stored peak data in register PR only by one or more unit of amplitude measurement in order for the output of the peak comparator AB to go high. However, when PNSV is active, a noise immunity exists because the new data must exceed the peak data of register PR by at least PNSV plus one.

The undiminished data of register RB is the data that is loaded into the peak register PR at appropriate times, and that is used in the comparison against threshold in comparator TC.

Two successive events must occur in order to activate PNSV. First, on one clock cycle the peak register PR must be loaded; that event is indicated by PKREGEN* is low. The indication is stored in a "D" flip-flop NV. Second, the peak register must not be loaded on the next clock cycle. This is sensed by PKREGEN* being high. When the two events have occurred in succession, as detected by a circuit comprising a flip-flop NV, an inverter 84 and an inverted NAND gate 86 of FIG. 6, the NAND gate 86 produces a zero signal at a point 88. A clock enable terminal 90 of a noise suppression register NS permits the desired noise value data NOISVAL, which is standing on the D terminals of the register NS, to be clocked in by a clock pulse, and the resulting peak noise value data stands in inverted data form as PNSV on output terminals of the register NS. The peak noise suppression value is subtracted, in subtractor SN, from the data at the output of DR, and the remainder is transferred to the register RA. The output data of RA is compared in the comparator AB with the contents of the peak register PR to ascertain whether the new data, as diminished by the peak noise suppression value and stored in RA, is greater or less than the full data stored in peak register PR. If yes, the undiminished new data in RB is transferred to PR.

The strobe circuits, shown on FIG. 5, include a strobe flip-flop SF that has a one-bit terminal 92. When the counter PT has timed out to zero, wired detector 63 sends a signal through an inverter 94 and an OR gate 96 to the terminal 92. A clock terminal 98 of the strobe flip-flop SF receives a clock pulse from the system clock CK and sets a strobe output signal, which serves as an output signal from the detector as a whole, at a terminal 100. The output signal from terminal 100 is connected also via a feedback line 104 to another input of the OR gate 96 to latch the flip-flop SF in an active state, and is also connected to the MR terminal of the peak timeout counter PT to reset that counter.

The strobe signal at 100 indicates that the data at the terminal 74 of register PR represents the peak of the pulse, (and that the peak occurred before the start of the strobe signal by a predetermined time delay equal to the preload of the timeout counter PT).

The strobe flip-flop SF can be cleared by a signal on its terminal 106, which it receives from an OR gate 108 whose inputs are (a) reset RST signals from other portions of the system (not shown) to indicate that they have received the necessary peak amplitude output data regarding the pulse, and (b) a negated valid data signal from a negated output terminal of the validation flip-flop VL, to keep the strobe flip-flop SF in a cleared state until valid data appears.

The strobe signal (occurring after a fixed delay from the peak) enables other pulse parameters to be measured correctly, such as carrier frequency of the received signal (assuming the pulse is a detected envelope of a carrier) and fine measurement of the direction of arrival. It provides information as to when the parameter to be measured should be sampled; the parameter can usually be most accurately sampled at the peak of the pulse rather than on its leading or trailing edge.

For narrow pulses the time during which the pulse is at or near its peak is of course very short. This necessitates that the combined uncertainties of any delays in the analog data path and the digital timing paths be small, and, in particular, that the combined uncertainties be less than the width of the narrow pulse being measured. The invented peak timeout method and circuit ensure that the uncertainty in the digital delay is less than one clock period, i.e., 12.5 nanoseconds.

The rate at which incoming pulses can be analyzed, called the throughput rate, is much greater for the invented circuit than for those of the prior art.

Many other embodiments of the invention are possible also; the invention is defined by the claim.

We claim

1. A method for detecting the peak amplitude of a waveform comprising the steps of:
    (a) sampling the amplitude of the waveform at successive times (A/D);
    (b) storing an amplitude (PR);
    (c) starting a predetermined time interval (PT);
    (d) providing an attenuated value of a new amplitude that occurs during said time interval (SN, RA);
    (e) storing the new amplitude itself if said attenuated value of said new amplitude exceeds the predecessor stored amplitude (PR);
    (f) starting a predetermined time interval (PT);

(g) repeating the three immediately preceding steps using subsequently-occurring amplitudes until the most recently started of said time intervals is completed without occurrence of an amplitude whose attenuated value exceeds its predecessor stored amplitude.

2. A method as in claim 1 and wherein each of said steps of storing after the first step of storing comprises replacing a previously stored amplitude (PR).

3. A method as in claim 1 and wherein all of said steps of starting predetermined time intervals comprise steps of starting programmable predetermined time intervals of equal duration (PT, TI).

4. A method as in claim 1 and wherein at least one of said steps of storing amplitudes comprises storing only amplitudes that exceed a predetermined threshold value (TC, 82 PR).

5. A method as in claim 1 and wherein at least one of said steps of starting a predetermined time interval comprises starting a time interval only if the amplitude sample exceeds a predetermined threshold value (TC, 70, 62).

6. A method as in claim 1 and comprising a further step, at the end, of providing a strobe signal conveying information regarding the time of occurrence of the largest amplitude (94, 96, SF) sample.

7. A method as in claim 6 and wherein said step of providing a strobe signal comprises providing a strobe signal based upon the time of completion of said most recently completed of said time intervals.

8. A method as in claim 6 and wherein said step of providing a strobe signal comprises keeping track of the number of successive amplitude samples that exceed a predetermined threshold value and providing a related strobe signal only if said number of samples exceeds a predetermined number.

9. A method as in claim 1 and comprising an additional first step of digitally programing said time interval.

10. A method as in claim 1 and further comprising:
an initial step of providing apparatus (84, 86, NV, NS, SN) for enabling and disabling the attenuation of the values of amplitude;
a step, performed at any time before step (b), of disabling the attenuation (NS, SN) so that, while it is disabled, an unattenuated value of amplitude is used instead of an attenuated value wherever an attenuated value is a specified in subsequent steps; and
a step, between any two storing steps, of enabling the attenuation of new values of amplitude and using attenuated values thereafter wherever specified in the steps.

11. A method as in claim 10 and wherein said step of enabling the attenuation (NS, SN) comprises the steps of:
keeping track (68, 84, 86, NS) of whether, upon a sampling, the corresponding amplitude is or it not stored (PR); and
enabling the attenuation following two successive sampling times (NV, NS) at the first of which the corresponding amplitude is stored, and at the second of which the corresponding amplitude is not stored.

12. A peak signal detector for analyzing a waveform, comprising:
sampling apparatus (A/D) for sampling the amplitude of the waveform at successive times;
means (PR) for receiving and storing a sampled amplitudes;
means for starting a predetermined time interval (PT) upon storing of an amplitude;
means (SN) for receiving a new amplitude that occurs during said time interval and for providing in response thereto an attenuated value of that amplitude;
means (AP) for comparing the attenuated value with the stored amplitude;
means (RB, PR) for storing the new amplitude itself if said attenuated value of said new amplitude exceeds the predecessor stored amplitude;
means (PT) for starting a predetermined time interval in response to storing of the new amplitude;
means (AB, PT, PR) for, upon occurrence of subsequent amplitudes, similarly storing the subsequent amplitudes, and starting subsequent time intervals, if the subsequent amplitude occurs during the immediately preceding time interval and if the attenuated value of the subsequent amplitude exceeds the preceding stored amplitude;
means (94, 96, SF) for producing an output signal when the most recently started of said time intervals is completed without occurrence of an amplitude whose attenuated value exceeds the stored amplitude.

13. A detector as in claim 12 and wherein all of said storage means comprise means for replacing a previously stored amplitude in a single storage means (PR).

14. A detector as in claim 12 and wherein all of said timing means comprise means (PT) for starting programable predetermined time intervals of equal duration.

15. A detector as in claim 12 and wherein said means (PR) for receiving and storing a sample amplitude comprises means (TC, 82, PR) for storing a sample amplitude only if the amplitude exceeds a predetermined threshold value.

16. A detector as in claim 12 and wherein all said means (PT) for starting a predetermined time interval comprise means (TC, 70, 62) for starting a predetermined time interval only if the amplitude exceeds a predetermined threshold value.

17. A detector as in claim 12 and wherein all of said timing means comprise a single timing means (PR, TI) for digitally programing said time intervals.

* * * * *